United States Patent
Shrekenhamer et al.

(10) Patent No.: US 11,926,925 B2
(45) Date of Patent: Mar. 12, 2024

(54) MOLECULAR-BEAM EPITAXY SYSTEM COMPRISING AN INFRARED RADIATION EMITTING HEATER AND A THERMALLY CONDUCTIVE BACKING PLATE INCLUDING AN INFRARED-ABSORBING COATING THEREON

(71) Applicant: The Johns Hopkins University, Baltimore, MD (US)

(72) Inventors: David B. Shrekenhamer, Bethesda, MD (US); Adrian A. Podpirka, Washington, DC (US); Michael C. Brupbacher, Catonsville, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 17/094,868

(22) Filed: Nov. 11, 2020

(65) Prior Publication Data
US 2021/0140069 A1     May 13, 2021

Related U.S. Application Data

(60) Provisional application No. 62/933,999, filed on Nov. 12, 2019.

(51) Int. Cl.
    *C30B 35/00*      (2006.01)
    *C30B 23/00*      (2006.01)
    (Continued)

(52) U.S. Cl.
    CPC .......... *C30B 35/007* (2013.01); *C30B 23/002* (2013.01); *C30B 23/025* (2013.01); *C30B 23/063* (2013.01)

(58) Field of Classification Search
    CPC ....... C30B 23/00; C30B 23/002; C30B 23/02; C30B 23/025; C30B 23/06; C30B 23/063;
    (Continued)

(56) References Cited

U.S. PATENT DOCUMENTS 4,945,774 A * 8/1990 Beard .................. C23C 14/505
                                                             310/104
5,100,832 A * 3/1992 Kitagawa .......... H01L 21/02631
                                                         257/E21.123
(Continued)

FOREIGN PATENT DOCUMENTS

GB         1242996 A * 2/1970 ............. C04B 35/10

OTHER PUBLICATIONS

A website entitled "Molybdenum—Boiling point—Melting Point—Thermal Conductivity—Expansion" available at https://material-properties.org/molybdenum-thermal-properties-melting-point-thermal-conductivity-expansion/ and accessed on Nov. 9, 2021. (Year: 2021).*

(Continued)

*Primary Examiner* — Kenneth A Bratland, Jr.
(74) *Attorney, Agent, or Firm* — Noah J. Hayward

(57) ABSTRACT

Methods and systems for growing thin films via molecular-beam epitaxy (MBE) on substrates are provided. The methods and systems utilize a thermally conductive backing plate including an infrared-absorbing coating (IAC) formed, for example, on one side of the thermally conductive backing plate to provide an asymmetric emissivity that absorbs infrared radiation (IR) on the side having the IRC and does not on the non-coated side of the thermally conductive backing plate (e.g., refractive metal or alloy). The asymmetric emissivity shields the thin film being deposited on a substrate from the IR during formation.

20 Claims, 11 Drawing Sheets

(51) Int. Cl.
*C30B 23/02* (2006.01)
*C30B 23/06* (2006.01)

(58) Field of Classification Search
CPC ......... C30B 29/00; C30B 29/10; C30B 29/46; C30B 29/48; C30B 33/00; C30B 33/02; C30B 35/00; C30B 35/007; C23C 14/06; C23C 14/0623; C23C 14/0629; C23C 14/54; C23C 14/541
USPC .......... 117/84, 106, 108, 200–202, 204, 937, 117/956
See application file for complete search history.

(56) References Cited

U.S. PATENT DOCUMENTS

| | | | | |
|---|---|---|---|---|
| 5,556,472 | A | * | 9/1996 | Nakamura ............... C23C 14/24 204/298.25 |
| 6,106,903 | A | * | 8/2000 | Upadhya ................... C23C 4/10 264/80 |
| 6,344,084 | B1 | * | 2/2002 | Koinuma ............. B01J 19/0046 118/729 |
| 2010/0183045 | A1 | * | 7/2010 | Nakahara ............... G01J 5/0007 374/130 |
| 2015/0240099 | A1 | * | 8/2015 | Chopra .................. C09D 11/52 252/513 |
| 2016/0005639 | A1 | * | 1/2016 | Ono ...................... C04B 37/026 361/234 |

OTHER PUBLICATIONS

A website entitled "Titanium—Boiling point—Melting Point—Thermal Conductivity—Expansion" available at https://material-properties.org/titanium-thermal-properties-melting-point-thermal-conductivity-expansion/ and accessed on Nov. 9, 2021. (Year: 2021).*

J.E. Boschker, et al. publication entitled "Surface reconstruction-induced coincidence lattice formation between two-dimensionally bonded materials and a three-dimensionally bonded substrate," Nano Letters, vol. 14, pp. 3534-3538 (2014). (Year: 2014).*

Y.-J. Chien, et al. publication entitled "Growth and transport properties of $Sb_2-xV_xTe_3$ thin films on sapphire substrates," Journal of Crystal Growth, vol. 283, pp. 309-314 (2005). (Year: 2005).*

A website entitled "Molybdenum disilicide (MoSi2)" available at https://www.azom.com/properties.aspx?ArticleID=512 and accessed on Sep. 12, 2023. (Year: 2023).*

* cited by examiner

MOLECULAR-BEAM EPITAXY SYSTEM COMPRISING AN INFRARED RADIATION EMITTING HEATER AND A THERMALLY CONDUCTIVE BACKING PLATE INCLUDING AN INFRARED-ABSORBING COATING THEREON

CROSS-REFERENCE TO RELATED APPLICATIONS

This application claims the benefit of and priority under 35 U.S.C. § 119(e) to prior-filed, co-pending U.S. Provisional Application Ser. No. 62/933,999, filed on Nov. 12, 2019, the content of which is expressly incorporated by reference herein in its entirety.

TECHNICAL FIELD

Example embodiments relate generally to methods and systems for growing thin films via molecular-beam epitaxy (MBE) on substrates by utilizing a thermally conductive backing plate including an infrared-absorbing coating (IAC) formed, for example, on one side of the thermally conductive backing plate to provide an asymmetric emissivity that absorbs infrared radiation (IR) on the side having the IRC and does not on the non-coated side of the thermally conductive backing plate (e.g., refractive metal or alloy). The asymmetric emissivity shields the thin film being deposited on a substrate from the IR during formation, for example, by absorbing IR on the side having the IRC and thermally conducting heat from the non-coated side of the thermally conductive backing plate to a substrate. In this regard, the asymmetric nature of the combination of the thermally backing plate and the IAC facilitates control of the temperature of the substrate surface upon which the thin film is being grown as well as the temperature of the thin film during growth.

BACKGROUND

Molecular beam epitaxy (MBE) allows deposition for the growth of structures requiring atomically precise control of nanometer thick layers. While MBE is considered a high precision growth technique, it is technically challenging due to the variety of variables that must be controlled (e.g., flux, crystallographic orientation, substrate temperature, surface preparation, layer termination, etc.). Often, a narrow window of growth conditions exist that must be maintained to produce suitable film growth. In particular, temperature is a critical variable which can affect adsorption, desorption, and surface diffusion of atoms on the growth surface. If the interplay between these different mechanisms is not well controlled, the resulting film quality (e.g., surface morphology, electrical properties, orientation, etc.) undesirably suffers. For example, a key concern with the growth of smaller bandgap materials on larger bandgap substrates via MBE is the radiative coupling of the deposited layer with the heater, which can lead to uncontrolled increases in temperature if not properly accounted for during the deposition process.

For example, film growth without proper temperature control during film formation or deposition can result in such effects as thickness limiting factors, surface roughness, three-dimensional growth as well as variations in the stoichiometry amongst others. Current techniques have looked at using band-edge thermometry to determine the initial growth temperature at the surface, but are essentially blind to measuring the temperature once the growth of the film is started, dependent on band alignments. As such, the ability to monitor and/or control the temperature during film formation or deposition is not achieved.

BRIEF SUMMARY

Non-limiting example embodiments include a molecular-beam epitaxy (MBE) system. The MBE system, accordance with example embodiments, includes an ultra-high vacuum (UHV) chamber, a heater that emits infrared radiation (IR), a thermally conductive backing plate including a first surface and a second surface, wherein at least the first surface includes an infrared-absorbing coating (IAC) thereon, a substrate positioned on the second surface of the thermally conductive backing plate, and at least one effusion cell directed towards the substrate. In accordance with example embodiments, the heater is positioned to emit IR through a portion of the UHV chamber and impinge the IAC. For example, the heater may be positioned in a location such that the heater is not in direct physical contact with the IAC and/or the thermally conductive backing plate, which may be configured to rotate to facilitate a more uniform deposition of a thin film thereon.

In another aspect, example embodiments include a method (e.g., a method of growing a film onto a substrate via an MBE process) including (i) a step of providing a thermally conductive backing plate including a first surface and a second surface, wherein at least the first surface includes an infrared-absorbing coating (IAC) thereon; (ii) positioning a first side of a substrate directly or indirectly onto the second surface of the thermally conductive backing plate, wherein the substrate has a first bandgap; and (iii) depositing a film onto a second side of the substrate via MBE, wherein the film has a second bandgap that is less than the first bandgap. In this regard, the material forming the film may have a bandgap that is notable less than the bandgap of the substrate upon which the film is deposited.

BRIEF DESCRIPTION OF THE DRAWING(S)

Example embodiments now will be described more fully hereinafter with reference to the accompanying drawings, in which some, but not all, embodiments are shown. Indeed, this invention may be embodied in many different forms and should not be construed as limited to the examples set forth herein; rather, these embodiments are provided so that this disclosure will exceed applicable legal requirements. Like numbers refer to like elements throughout, and wherein.

DETAILED DESCRIPTION

Figure 1:
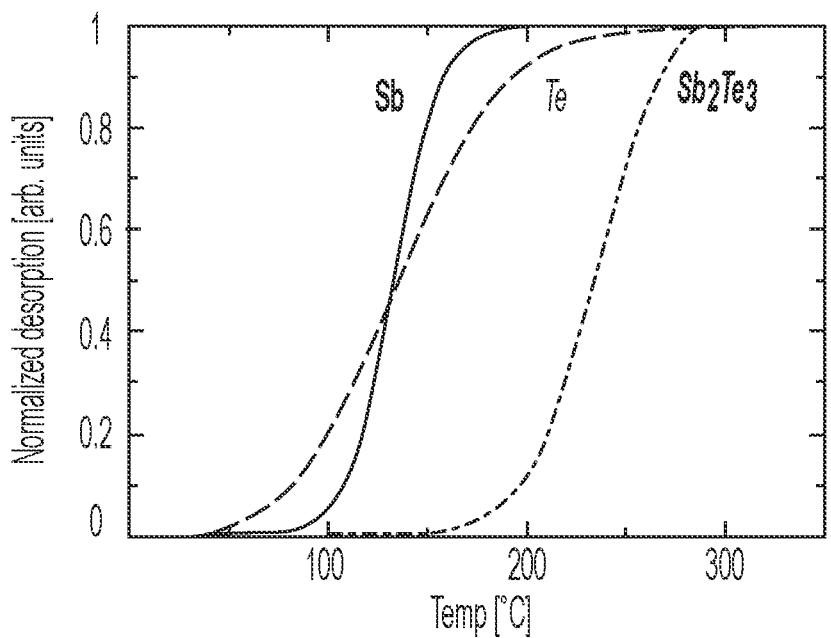
FIG. 1 illustrates the growth regime for antimony telluride ($Sb_2Te_3$) by plotting the normalized desorption of Sb, Te, and $Sb_2Te_3$ as a function of temperature.

Example embodiments now will be described more fully hereinafter with reference to the accompanying drawings, in which some, but not all embodiments are shown. Indeed, the present invention may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

Example embodiments relate generally to addressing the temperature instability in MBE deposition processes due to high absorption in the growth film, which is a major obstacle towards growing in low band-gap materials (e.g., mercury cadmium telluride —HgCdTe). The current challenge with growth of low bandgap materials via MBE is that the thermal heating is through non-conductive means, and hence transfers through radiative pathways. This is dictated by the fact that the sample holder needs to rotate during growth for surface uniformity and thus the heater is not able to be in direct contact with the growth substrate. The heating relies primarily on absorption within the substrate, which is typically a high bandgap material such as, for examples only, silicon (Si) or gallium arsenide (GaAs). When depositing a low-bandgap material the increased absorption results in an increase in surface temperature and thus may negatively influence the growth dynamics. Accordingly, certain embodiments, i.e. non-limiting example embodiments, relate to methods and systems including a thermally conductive backing plate including a first surface and a second surface, wherein at least the first surface includes an infrared-absorbing coating (IAC) thereon. The thermally conductive backing plate, in accordance with certain embodiments, may comprise a high reflectance material and consequently a low absorption/emissive surface without the addition of the IAC. In this regard, the backing plate alone (i.e., no IAC formed thereon) may not be sufficient to promote efficient radiative transfer. Moreover, the backing plate surface in contact with the substrate is only transferring heat through thermal conduction and not additional radiative transfer. Stated somewhat differently, the thermally conductive backing plate, in accordance with certain embodiments, may include a low absorption material that allows the substrate and/or the film material being deposited on the substrate to be heated by the radiant energy that is not absorbed or shielded by the thermally conductive backing plate in the absence of the IAC. The IAC on a surface of the thermally conductive backing plate facing the heater, however, may absorb the radiant heat from the heater and transfer heat to the substrate via thermal conduction. In accordance with certain embodiments the thermally conductive backing plate including an IAC enables and/or facilitates precise temperature control (e.g., reach one or more desired temperatures and maintain the desired temperature throughout growth of the film via a MBE process) at the surface of the growth substrate. In accordance with certain embodiments, the thermally conductive backing plate including an IAC enables and/or facilitates the heating of the substrate to elevated temperatures (>600 degrees Celsius) that would not be possible with a bare metal backing plate (e.g., a molybdenum (Mo) metal backing plate without an IAC). The thermally conductive backing plate including an IAC can shield a majority, substantially all, or all of the radiative transfer from the heater into the growth substrate, while pairing the high absorption IAC facing the heater to promote high efficiency radiative transfer that allows the sample (e.g., substrate to which the film will be deposited or grown) to achieve the higher temperatures needed to prepare the surface for epitaxial growth, for example to remove any oxide on the surface of many candidate substrates. For example only, a Mo metal backing plate with a molybdenum disilicide ($MoSi_2$) coating are both able to survive temperatures well in excess of 1000° C., allowing the combination to conductively transfer the heat into the growth substrate, providing a stable temperature for entirety of the growth. In accordance with certain embodiments, the metals or the metal alloys forming the thermally conductive backing plate may include a low absorption across the same range that the heater is radiating across.

Systems and methods, in accordance with certain embodiments, related to MBE processes. In this regard, the systems and methods may include a MBE process for growing thin films on a substrate, in which the chemical constituents forming the thin films is not particularly limited. In accordance with certain embodiments, the systems and methods may employ one or more chalcogenides for formation of thin films via a MBE process. For instance, any material capable for being grown via a MBE process may be grown in accordance with certain embodiments. For example only, any combination of bismuth (Bi), selenium (Se), antimony (Sb), tellurium (Te), and germanium (Ge). For instance, thin films such as germanium telluride (GeTe), antimony telluride ($Sb_2Te_3$), and germanium-antimony-tellurium (GeSbTe) may be formed, which have applications in phase change materials, such as interfacial phase change materials. In this regard, certain embodiments provide phase change devices (e.g., interfacial phase change devices). For instance, thin films such as bismuth telluride ($Bi_2Te_3$), $BiSbTe_3$, and $Bi_2Te_2Se$ may be formed, which have applications in thermoelectric materials. For instance, thin films such as bismuth selenide ($Bi_2Se_3$), bismuth telluride ($Bi_2Te_3$), and antimony telluride ($Sb_2Te_3$) may be formed, which have applications in topological insulator materials.

Figure 2:
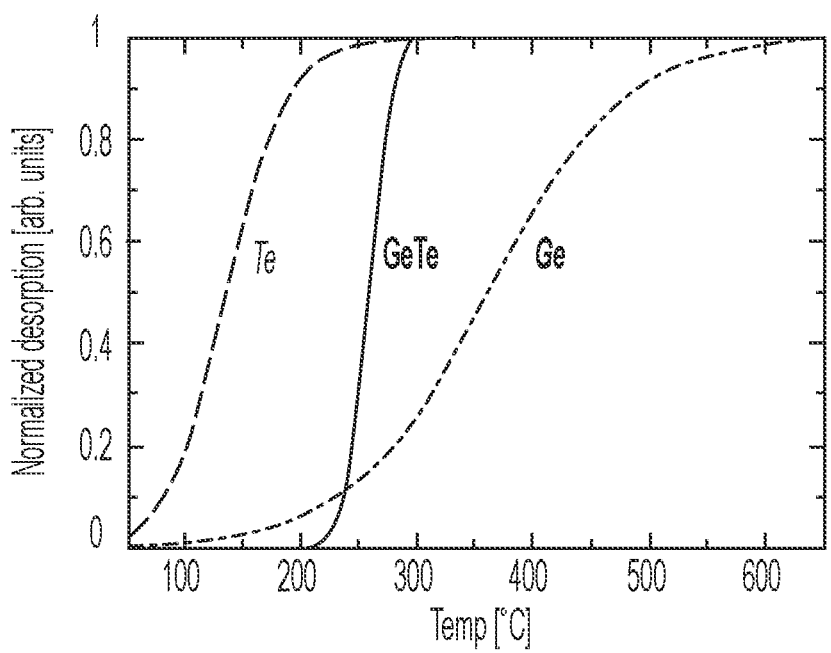
FIG. 2 illustrates the growth regime for germanium telluride (GeTe) by plotting the normalized desorption of Ge Te, and GeTe as a function of temperature.
Figure 3:
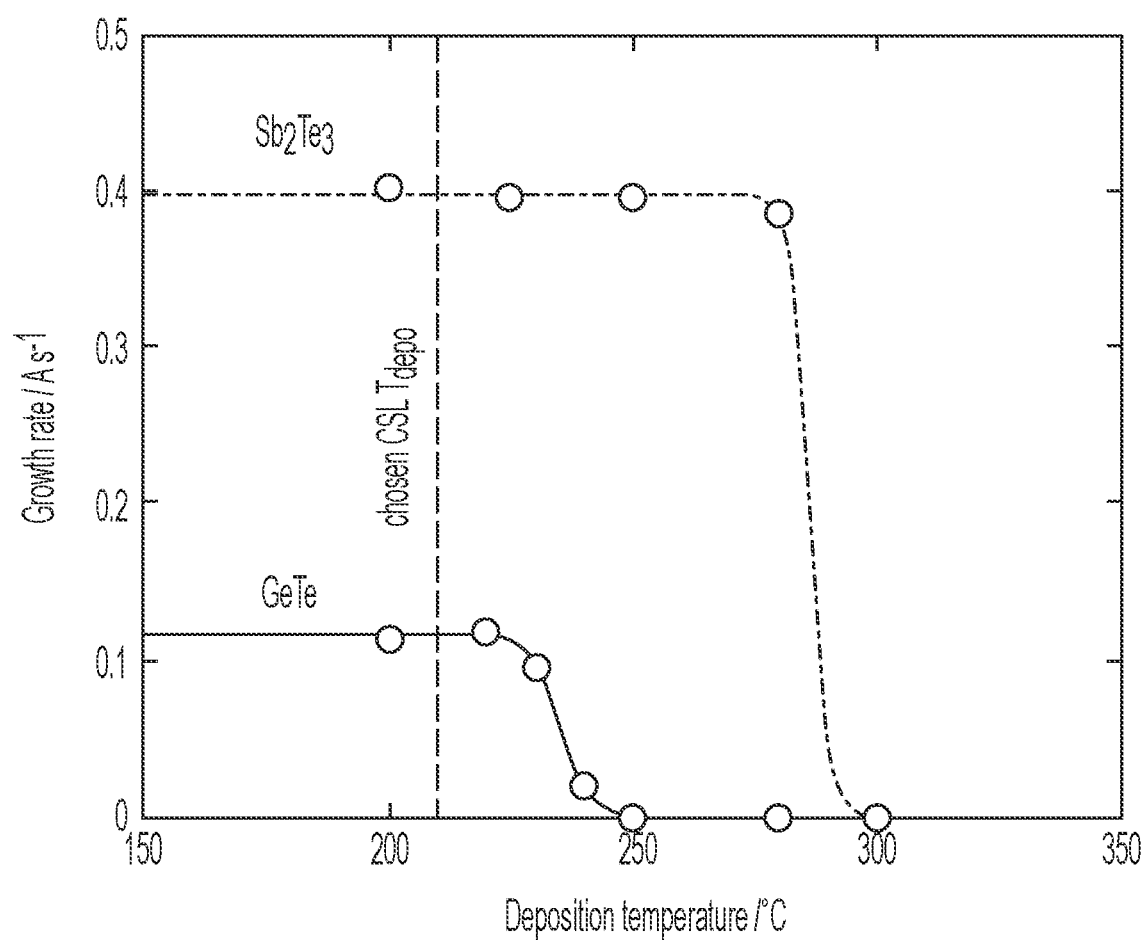
FIG. 3 is a graph plotting the growth rate for $Sb_2Te_3$ and GeTe as a function of deposition temperature.
Figure 4:
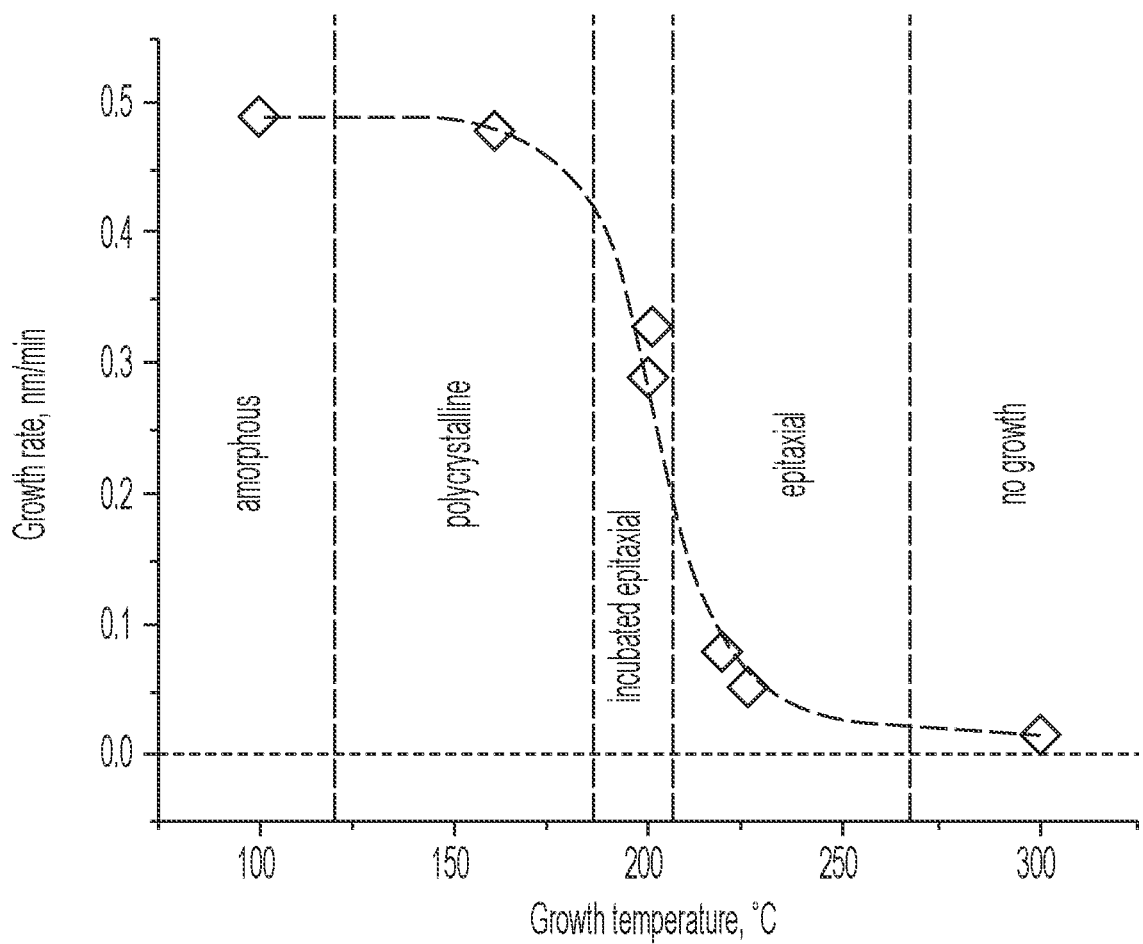
FIG. 4 illustrates regions of depositional forms overlaid on a plot of growth rate as a function of growth temperature for an example material of GeTe.

To illustrate the importance of temperature control of the growth surface, FIG. 1 and FIG. 2 illustrate growth regimes of a few low band gap materials. FIG. 1 illustrates the growth regime for antimony telluride ($Sb_2Te_3$) by plotting the normalized desorption of Sb, Te, and $Sb_2Te_3$ as a function of temperature. FIG. 2 illustrates the growth regime for germanium telluride (GeTe) by plotting the normalized desorption of Ge Te, and GeTe as a function of temperature. As can be seen in both FIGS. 1 and 2, these example materials have temperature windows in which the low bandgap material can grow. FIG. 3 presents this information in a different format by plotting the growth rate for each of these example low bandgap materials as a function of deposition temperature. As illustrated by FIGS. 1 and 3, growth of $Sb_2Te_3$ will not occur at temperatures exceeding around 300° C. FIGS. 2 and 3 illustrate that growth of GeTe will not occur at temperatures of about 250° C. and above. Accordingly, temperature spikes at the growth surface of the forming film can impact the uniformity of the forming film (e.g., desorption of from the substrate, holes or gaps within the film due to non-growth at locations or times correlated to temperature spikes at the growth surface). Although a particular material may be able to grow in a particular temperature window of operation, the quality of the material being grown or deposited is often times not uniform throughout the temperature window. FIG. 4, for instance shows regions of depositional forms (e.g., amorphous material formation, polycrystalline material formation, etc.) overlaid on a plot of growth rate as a function of growth temperature for the example material of GeTe. As illustrated in FIG. 4, fluctuations in temperature at the growth surface during deposition can change the quality or form of the GeTe being deposited. Typically, such a fluctuation from one form or state of GeTe (for example) to another during deposition is undesirable as a resulting film having more than one deposited form or state often exhibits undesirable properties due to, for example, the non-uniform state or form of the deposited material. For instance, inconsistent temperature control at the growth surface may ultimately produce a film including more than one crystalline form, orientation, and/or growth regime, which may be undesirable. As such, an operating temperature window for a given material may be defined to provide the desired crystalline form in a uniform manner for a deposited film, while deviation from outside this operating temperature may be desirably avoided during the deposition or film forming process via MBE. In accordance with certain embodiments, the systems and methods may include providing and/or maintaining a stable temperature growth window, in which the systems and methods maintain surface temperature in the temperature window known for providing epitaxial growth.

Certain embodiments provide a molecular-beam epitaxy (MBE) system. The MBE system, in accordance with certain embodiments, may include an ultra-high vacuum (UHV) chamber, a heater that emits infrared radiation (IR), a thermally conductive backing plate including a first surface and a second surface, wherein at least the first surface includes an infrared-absorbing coating (IAC) thereon, a substrate positioned on the second surface of the thermally conductive backing plate, and at least one effusion cell directed towards the substrate. In accordance with certain embodiments, the IAC is UHV compatible. For example, the UHV compatible IAC has a strong adherence to the thermally conductive backing plate and does not delaminate (e.g., dislodge in part or in entirety) or outgas off the surface of the thermally conductive backing plate under UHV conditions (e.g., about $1\times10^{-8}$ Torr to $1\times10^{-10}$ Torr). The IAC, in accordance with certain embodiments, the IAC may be formed on the thermally conductive backing plate via a thermal plasma spray operation, in which the IAC is UHV compatible as noted above. An IAC formed by thermal plasma spraying, in accordance with certain embodiments, has been shown to provide superior adherence and stability as compared to other coating techniques. In accordance with certain embodiments, the heater is positioned to emit IR through a portion of the UHV chamber and impinge the IAC. For example, the heater may be positioned in a location such that the heater is not in direct physical contact with the IAC and/or the thermally conductive backing plate, which may be configured to rotate to facilitate a more uniform deposition of a thin film thereon. For instance, the thermally conductive backing plate may be configured to rotate about a z-axis extending perpendicularly through a first surface and a second surface of the thermally conductive backing plate.

Figure 5:
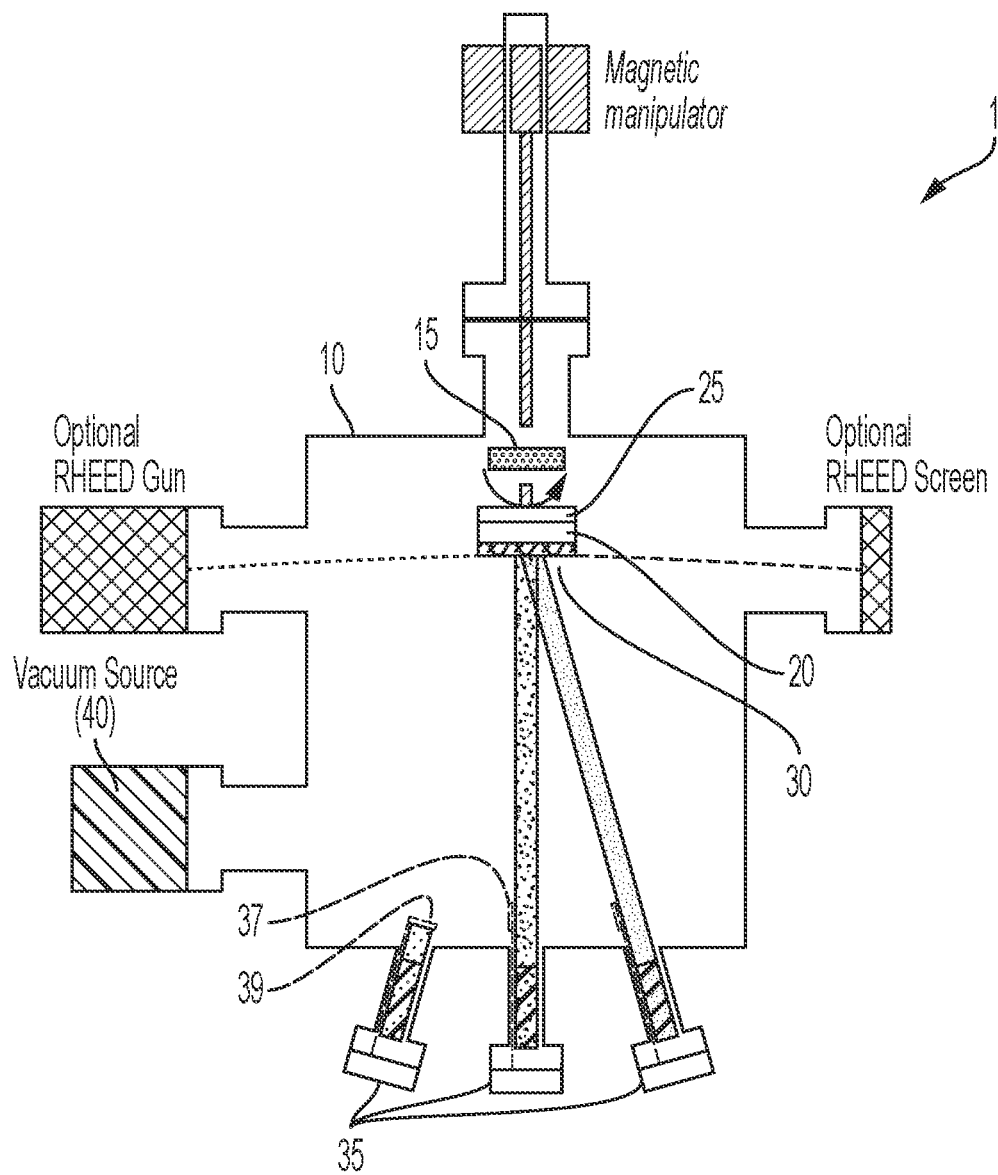
FIG. 5 illustrates a schematic of a MBE system in accordance with certain embodiments.

FIG. 5, for instance, provides a schematic of an MBE system in accordance with certain embodiments. As shown in FIG. 5, the MBE system 1 includes a UHV chamber 10 housing a heater 15 that emits IR towards and onto a thermally conductive backing plate 20 that includes an IAC 25 formed on a first surface of the thermally conductive backing plate. In this regard, the IR emitted by the heater 15 initially strikes the IAC 25. The system also includes a substrate 30 positioned on a second surface of the thermally conductive backing plate 20. As illustrated in FIG. 5, the thermally conducting backing plate 20, upon which the substrate 30 rests, is configured to rotate, such as by being magnetically coupled to a magnetic manipulator (although numerous other means for effecting a rotational configuration or functionality to the thermally conductive backing plate). The MBE system 1 may also include at least one effusion cell 35 positioned or oriented in a manner to deposit atoms of particular interest to deposit and grow a film onto the substrate 30. The effusion cells 35 may be correlated with respective shutters 37, 39. As show in FIG. 5, for example, shutters 37 are in an open state to allow deposition of atoms onto the surface of the substrate 30, while shutter 39 is in a closed state. As also shown in FIG. 5, the MBE system 1 may also include a vacuum source 40 that forms the vacuum within the UHV Chamber 10.

In accordance with certain embodiments, the heater emits infrared radiation within wavelengths from about 700 nanometers to about 1 millimeter, such as at least about from any of the following: 700, 1,000, 1,500, 3000, 5,000, 10,000, 20,000, 50,000, 80,000, 100,000, 200,000, 300,000, and 500,000 nm, and/or at most about any of the following: 1,000,000, 800,000, 600,000, and at most about 500,000 nm. In accordance with certain embodiments, the heater may also emit radiation within the wavelengths from about 200 nanometers to about 700 nanometers.

In accordance with certain embodiments, the heater is located separately from the thermally conductive backing plate or the IAC. In this regard, the heater imparts IR into the IAC and this energy is absorbed by the IAC and conveyed into and through the thermally conducting backing plate by conductive heat transfer to ultimately heat the substrate. For instance, the IAC is heated by radiative heat transfer from the heater through the vacuum held within the UHV chamber. In accordance with certain embodiments, for example, the heater is located separately from the thermally conductive backing plate and the IAC. Stated somewhat differently, the heater is not in direct physical contact with the IAC and/or the thermally conductive backing plate. In accordance with certain embodiments, the IAC is located proximate to the heater and the substrate is located distal to the heater. For instance, the IAC is located closer to the heater than the thermally conductive backing plate. In this regard, the IAC in effect intercepts the IR emitted from the heater and absorbs a majority, substantially all, or all IR emitted from the heater. As the IAC becomes heated by the IR from the heater, heat is conducted (e.g., thermal conduction) into and through the thermally conductive backing plate and finally conducted (e.g., thermal conduction) into the substrate. In accordance with certain embodiments, the heat that is conducted into and through the thermally conductive backing plate and finally into the substrate is uniformly spread throughout the x-y plane of the thermally conductive backing plate, which may have the form of a flat disc wherein the perpendicular distance between the first and second surfaces include a z-direction of the thermally conductive backing plate). For example, the uniform distribution of heat into and through the thermally conductive backing plate mitigates or eliminates the presence of undesirable "hot-spots" where one region of the thermally conductive backing plate has a larger temperature than a second region of the thermally conductive backing plate. In accordance with certain embodiments, the heater may include a coil that can result in thermal spatial non-uniformities in the absence of the IAC. Accordingly, the IAC may radiatively decouple the substrate from the heater. Stated somewhat differently, the IAC may shield the radiative transfer of heat from the heater into the substrate used for growth, while pairing the IAC facing the heater to promote high efficiency radiative transfer that allows the substrate to by conductively heated.

In accordance with certain embodiments, the thermally conductive backing plate includes a material having a thermal conductivity of at least about 20 W/m*K at 20° C., such as from at least about any of the following: 20, 40, 50, 60, 80, 100, 120, 130, 150, 180, 200, 400, 600, 800, and 1000 W/m*K at 20° C., and/or at most about any of the following: 2000, 1800, 1600, 1400, 1200, and 1000 W/m*K at 20° C. The thermally conductive backing plate, in accordance with certain embodiments, may include a variety of materials including, for example, metals and metal alloys. Example refractory metals and refractory metal alloys may include niobium and niobium alloys, molybdenum and molybdenum alloys, tantalum and tantalum alloys, tungsten and tungsten alloys, and rhenium and rhenium alloys. In accordance with certain embodiments, the metals or the metal alloys may include a low absorption across the same range that the heater is radiating across.

The IAC, in accordance with certain embodiments, may absorb from at least about 5%, such as at least about 50%, such as at least about 75% of all infrared radiation within wavelengths from about 700 nanometers to about 1 millimeter. For instance, the IAC may absorb at least about any of the following: 5, 10, 15, 20, 25, 30, 40, 50, 60, 70, 75, 80, and 85% of all infrared radiation within wavelengths from about 700 nanometers to about 1 millimeter, and/or at most about any of the following: 100, 99, 98, 96, 95, 97, 92, 80, 88, 86, and 85% of all infrared radiation within wavelengths from about 700 nanometers to about 1 millimeter. In accordance with certain embodiments, the IAC additionally or alternatively may absorb at least about any of the following: 5, 10, 15, 20, 25, 30, 40, 50, 60, 70, 75, 80, and 85% of all radiation within wavelengths from about 200 nanometers to about 700 nanometers, and/or at most about any of the following: 100, 99, 98, 96, 95, 97, 92, 80, 88, 86, and 85% of all radiation within wavelengths from about 200 nanometers to about 700 nanometers. In accordance with certain embodiments, the IAC absorbs a sufficient amount of radiant energy from the heater to prevent a wide range of radiant energy from the heater to be absorbed by the newly formed or forming thin film.

In accordance with certain embodiments, the IAC has a thermal conductivity of at least about 5 W/m*K, such as from at least about any of the following: 5, 10, 15, 20, 40, 50, 60, 80, 100, 120, 130, 150, 180, 200, 400, 600, 800, and 1000 W/m*K at 20° C., and/or at most about any of the following: 2000, 1800, 1600, 1400, 1200, and 1000 W/m*K at 20° C. The IAC, in accordance with certain embodiments, may include a variety of materials including, for example silicides, borides, or carbides can be combined with compatible refractory backing material to form $MoSi_2$ and $WSi_2$ as two examples. In accordance with certain embodiments, the IAC coating is compatible with an MBE growth process and, thus, UHV conditions. The IAC, for example, may be formed by a thermal plasma spray operation, in which the IAC may be formed by converting the refractory substrate (e.g., thermally conductive backing plate) at the surface to a high emissive IAC.

In accordance with certain embodiments, the substrate may include a variety of materials upon which thin films may be grown via a MBE process. In accordance with certain embodiments, the substrate may include, for example only, silicon, gallium arsenide, indium phosphide, gallium phosphide, germanium, gallium nitride, aluminum nitride, silicon nitride, silicon carbide, silicon germanium, boron nitride, diamond, quartz, silica, alumina, and Sapphire. In accordance with certain embodiments, the substrate may include a bandgap of at least about 0.1 eV, such as at least about any of the following: 0.1, 0.2, 0.3, 0.4, 0.5, 0.6. 0.8, 1.0, 1.2, 1.4, 1.8, 2, 4, 6, and 8 and/or at most about 10, 9, and 8 eV. Silicon, for example, has a bandgap of 1.1 eV. GaAs has a bandgap of 1.43 eV and sapphire has a bandgap of 10 eV. Systems, in accordance with certain embodiments, may be particularly suitable for growth of thin films having a lower bandgap than that of the substrate.

In another aspect, example embodiments provide a method (e.g., a method of growing a film onto a substrate via a MBE process) including (i) a step of providing a thermally conductive backing plate including a first surface and a second surface, wherein at least the first surface includes an infrared-absorbing coating (IAC) thereon; (ii) positioning a first side of a substrate directly or indirectly onto the second surface of the thermally conductive backing plate, wherein the substrate has a first bandgap; and (iii) depositing a film onto a second side of the substrate via MBE, wherein the film has a second bandgap that is less than the first bandgap. In this regard, the material forming the film may have a bandgap that is notable less than the bandgap of the substrate upon which the film is deposited. In accordance with certain embodiments, the method may be carried out with a MBE system as described and disclosed herein.

In accordance with certain embodiments, the method may include use of a substrate having a first bandgap and a deposited film having a second bandgap, wherein a bandgap-ratio between the first bandgap (eV) and the second bandgap (eV) is at least about 1.1:1, such as at least about any of the following: 1.1:1, 1.5:1, 2:1, 3:1, 4:1, 5:1, 6:1, 7:1, 8:1, 9:1, 10:1, 12:1, 15:1, 18:1, 20:1; 25:1, and 30:1, and/or at most about any of the following: 100:1, 70:1, 60:1, 50:1, 45:1, 40:1, 35:1, and 30:1.

In accordance with certain embodiments, the method may include providing a heater that emits infrared radiation and is located separately from the thermally conductive backing plate and the IAC, wherein the IAC is located proximate to the heater and the substrate is located distal to the heater. For instance, the IAC is located closer to the heater than the thermally conductive backing plate. In this regard, the IAC in effect intercepts the IR emitted from the heater and absorbs a majority, substantially all, or all IR emitted from the heater. As the IAC becomes heated by the IR from the heater, heat is conducted (e.g., thermal conduction) into and through the thermally conductive backing plate and finally conducted (e.g., thermal conduction) into the substrate. Accordingly, the IAC may radiatively decouple the substrate from the heater. Stated somewhat differently, the IAC may shield the radiative transfer of heat from the heater into the substrate used for growth, while pairing the IAC facing the heater to promote high efficiency radiative transfer that allows the substrate to by conductively heated.

The heater, as noted above, may be turned on and emit infrared radiation within wavelengths from about 700 nanometers to about 1 millimeter, such as at least about from any of the following: 700, 1,000, 1,500, 3000, 5,000, 10,000, 20,000, 50,000, 80,000, 100,000, 200,000, 300,000, and 500,000 nm, and/or at most about any of the following: 1,000,000, 800,000, 600,000, and at most about 500,000 nm. In accordance with certain embodiments, the heater may also emit radiation within the wavelengths from about 400 nanometers to about 700 nanometers.

In accordance with certain embodiments, the thermally conductive backing plate, as noted above, may include a material having a thermal conductivity of at least about 20 W/m*K at 20° C., such as from at least about any of the following: 20, 40, 50, 60, 80, 100, 120, 130, 150, 180, 200, 400, 600, 800, and 1000 W/m*K at 20° C., and/or at most about any of the following: 2000, 1800, 1600, 1400, 1200, and 1000 W/m*K at 20° C. Similarly as noted above, the IAC may have a thermal conductivity of at least about 5 W/m*K, such as from at least about any of the following: 5, 10, 15, 20, 40, 50, 60, 80, 100, 120, 130, 150, 180, 200, 400, 600, 800, and 1000 W/m*K at 20° C., and/or at most about any of the following: 2000, 1800, 1600, 1400, 1200, and 1000 W/m*K at 20° C.

In accordance with certain embodiments, the IAC absorbs from at least about 5%, such as at least about 50%, such as at least about 75% of all infrared radiation within wavelengths from about 700 nanometers to about 1 millimeter. For instance, the IAC may absorb at least about any of the following: 5, 10, 15, 20, 25, 30, 40, 50, 60, 70, 75, 80, and 85% of all infrared radiation within wavelengths from about 700 nanometers to about 1 millimeter, and/or at most about any of the following: 100, 99, 98, 96, 95, 97, 92, 80, 88, 86, and 85% of all infrared radiation within wavelengths from about 700 nanometers to about 1 millimeter. In accordance with certain embodiments, the IAC additionally or alternatively may absorb at least about any of the following: 5, 10, 15, 20, 25, 30, 40, 50, 60, 70, 75, 80, and 85% of all radiation within wavelengths from about 200 nanometers to about 700 nanometers, and/or at most about any of the following: 100, 99, 98, 96, 95, 97, 92, 80, 88, 86, and 85% of all radiation within wavelengths from about 200 nanometers to about 700 nanometers. In accordance with certain embodiments, the IAC absorbs a sufficient amount of radiant energy from the heater to prevent a wide range of radiant energy from the heater to be absorbed by the newly formed or forming thin film.

In accordance with certain embodiments, the method may further include depositing a thin film via a MBE process under high vacuum or ultra-high vacuum conditions. For instance, the method may include obtaining a vacuum within the UHV chamber from, for example, about $1 \times 10^{-8}$ Torr to $1 \times 10^{-10}$ Torr prior to initial deposition of a material or materials onto the substrate.

In accordance with certain embodiments, the method may include pre-heating the substrate to an initial elevated temperature that is sufficient to remove at least a majority of any oxides that may be present on the second surface of the substrate. The step of pre-heating the substrate to a predetermined elevated temperature associated with removal of any oxides present on the second surface (e.g., growth surface) of the substrate may be monitored, for example, by band-edge spectroscopy. For example, the step of pre-heating the substrate may include raising the temperature of the substrate to over 600° C., such as at least about 620, 630, 640, 650, 700, 750, or 800° C. After the predetermined initial elevated temperature associated with removal of any oxides, the temperature of the second surface (e.g., growth surface) is allowed to lower down to a predetermined operating temperature associated for the deposition and/or growth of a particular material of choice (e.g., film material to be deposited and grown on the substrate). For example, the method may further include adjusting the initial elevated temperature to an operating temperature desired for depositing the film, in which the operating temperature is less than the initial elevated temperature. As noted above, different film materials may have a particular operating temperature associated with epitaxial growth. Once the substrate reaches a steady temperature value associated with the predetermined operating temperature, the method may include the epitaxial deposition of one or more materials forming a thin film onto the second surface of the substrate.

In accordance with certain embodiments, the method further includes maintaining the predetermined operating temperature during the majority or the entirety of the step of depositing the film onto the second side of the substrate via MBE. In this regard, the IAC-coated thermally conductive backing plate enables the system and method to maintain the temperature of the growth surface, the substrate, and the growing film at a constant and uniform temperature as discussed and described herein. In accordance with certain embodiments, the method maintains the temperature of the growth surface, the substrate, and the growing film at the predetermined operating temperature or within about 10° C. of the predetermined operating temperature, such as within about 8, 6, 5, 3, and 2° C. of the predetermined operating temperature.

In accordance with certain embodiments, the method may include growing a thin film via a MBE process, in which the final thin film has a thickness of at least about 0.1 nanometers (nm), such as at least about 0.5 nm, or at least about 1 nm. In accordance with certain embodiments, the final thin film may have a thickness of at least about any of the following: 0.1, 0.5, 1, 3, 5, 10, 100, 200, 500, 800, 1000, 1500, and 2000 nanometers, and/or at most about any of the following: 100,000, 75,000, 50,000, 25,000, 20,000, 10,000, 5,000, 3,000, 2000, 1800, 1600, 1500, 1400, and 1200 nanometers.

In accordance with certain embodiments, the method may include positioning a conductivity enhancing material between the thermally conductive backing plate and the IAC. If present, the conductivity enhancing material may be provided in a variety of forms, such as a paste. Since thermal conductivity from the IAC to the thermally conductive backing plate, and from the thermally conductive backing plate to the substrate may be slightly reduced due the UHV environment, the conductivity enhancing material may help offset any such reduction in thermal conductivity due to the UHV environment. In accordance with certain embodiments, the conductivity enhancing material may include gallium or indium metals, or UHV compatible and high temperature pastes composed of silver or carbon flakes.

In accordance with certain embodiments, materials (e.g., substrates having a thin film deposited thereon) formed by systems and/or methods described and disclosed herein have applications in a variety of devices including, for example, focal point arrays, memory devices, display technologies (e.g., QLED), quantum optics, optical storage, quantum sensors, quantum computing, integrated photonics, spatial light modulators, neuromorphic computing, LIDAR, radio frequency switches, non-linear optics, photovoltaics, thermoelectrics, and battery cathode/anode.

Working Examples

The present disclosure is further illustrated by then following examples, which in no way should be construed as being limiting. That is, the specific features described in the following examples are merely illustrative and not limiting.

Figure 6A:
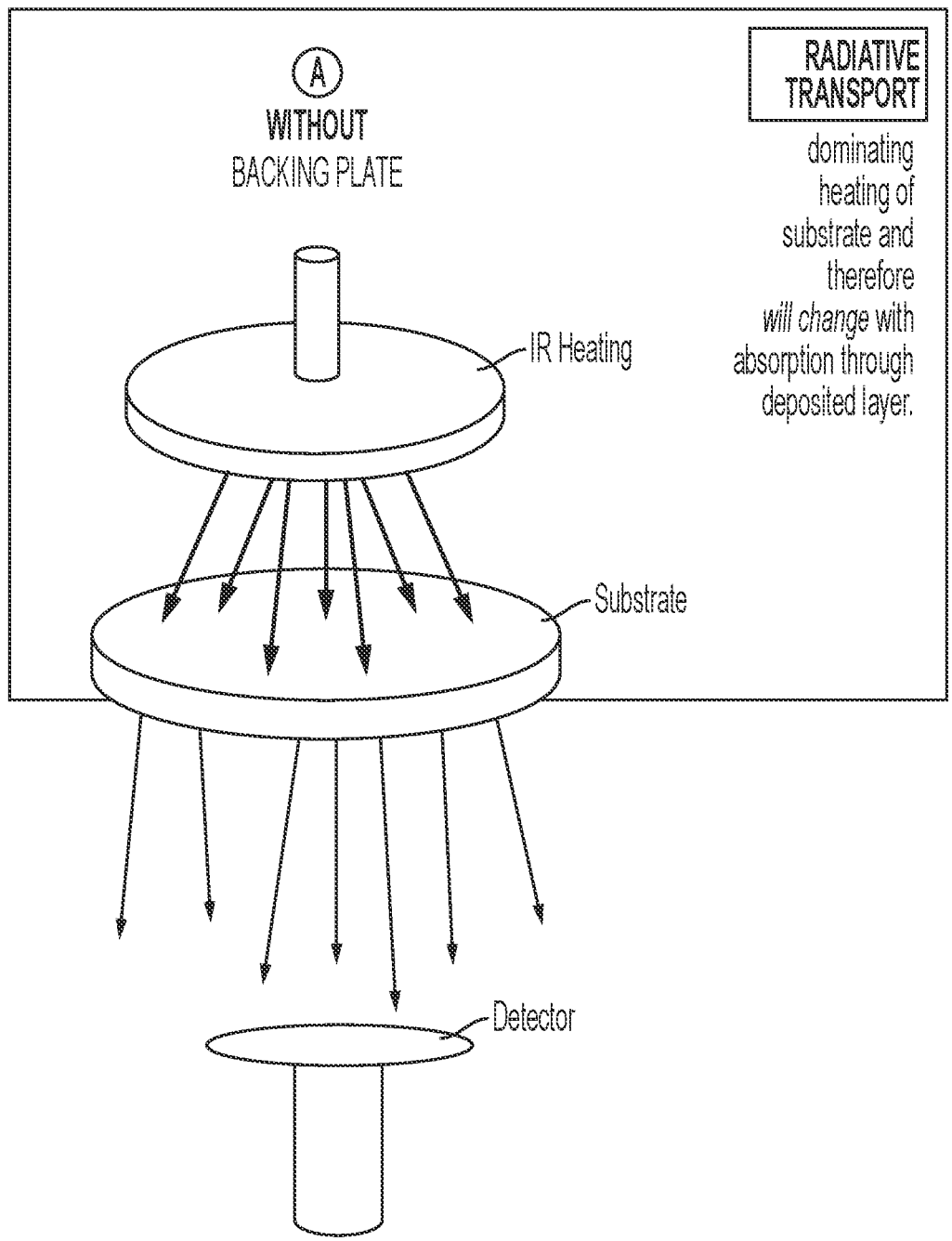
FIG. 6A is a schematic of a radiatively coupled substrate to a heater.

A schematic of a radiatively coupled substrate to the heater is given in FIG. 6A. As a smaller bandgap layer is deposited, the absorption via radiative transport increases leading to increased film temperature. It is understood, for example, that during the growth of low-bandgap indium arsenide (InAs) (0.42 eV) on gallium arsenide (GaAs) (1.44 eV), a temperature increase of nearly 150° C. may be observed over the course of growth. Similar increases in temperatures with other narrow bandgap systems are known as well. This increased absorption, and therefore increased film temperature, limits the thickness of low bandgap films which can be deposited via MBE.

Figure 6B:
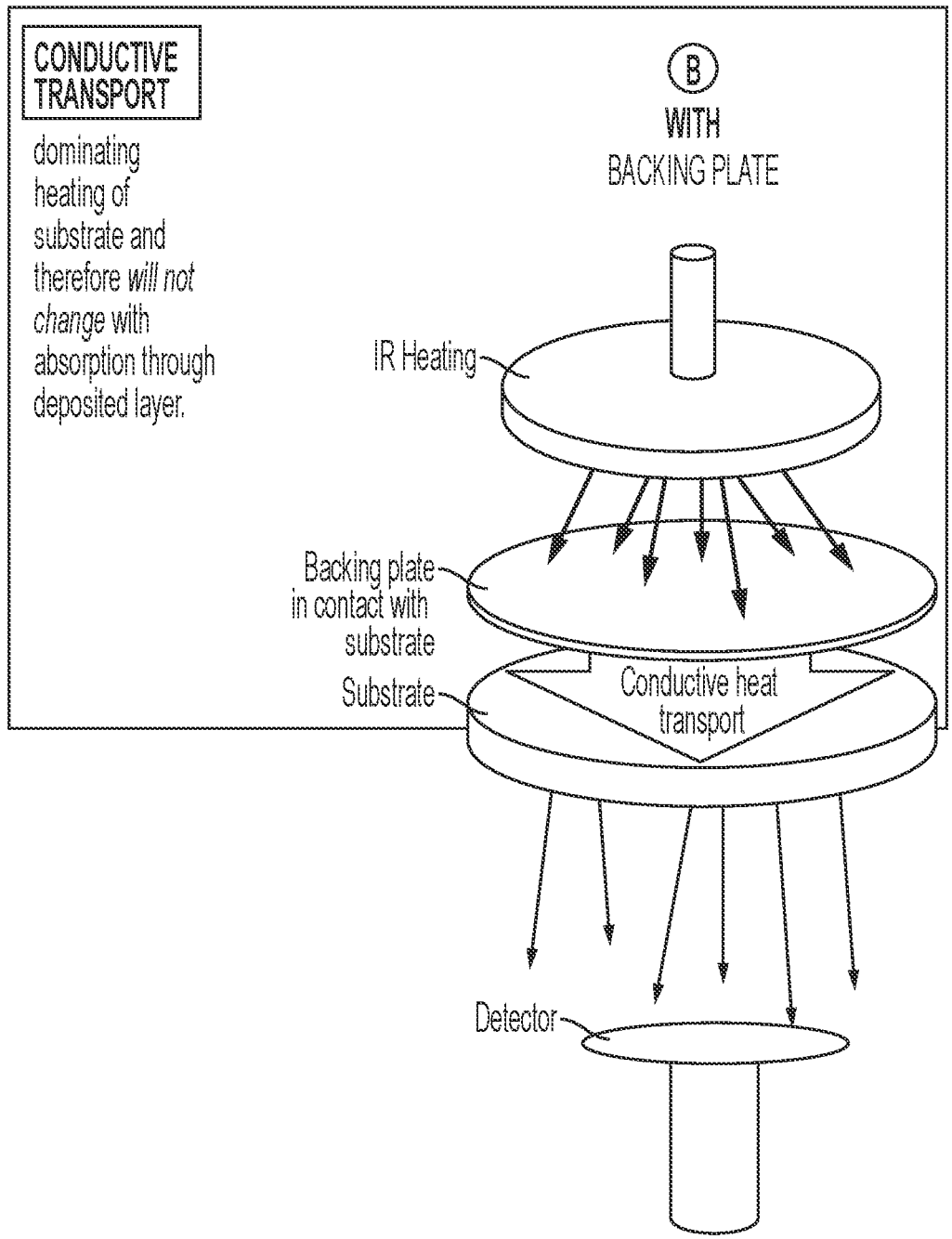
FIG. 6B is a schematic of a radiatively decoupled substrate to a heater via a molybdenum disilicide ($MoSi_2$) coating (i.e., an IAC) on the thermally conductive backing plate.

The following examples demonstrate a method of temperature control for MBE deposition of narrow bandgap materials on wider bandgap substrates. In these examples, thermally conductive metal backing plates a molybdenum disilicide ($MoSi_2$) coating (i.e., an IAC), as shown in FIG. 6B. This bilayer backing plate (e.g., thermally conductive backing plate including a $MoSi_2$ coating formed on one side thereof) enables the stabilization of the temperature window for obtaining thick epitaxial films and decouples the radiative heating of the substrate from that of the growing film thereby allowing the substrate to be heated conductively rather than radiatively. The addition of the $MoSi_2$ coating allows the plate to reach over 620° C., by efficiently absorbing as compared to a bare molybdenum (Mo) metal backing plate which will be discussed in greater detail later.

Figure 6C:
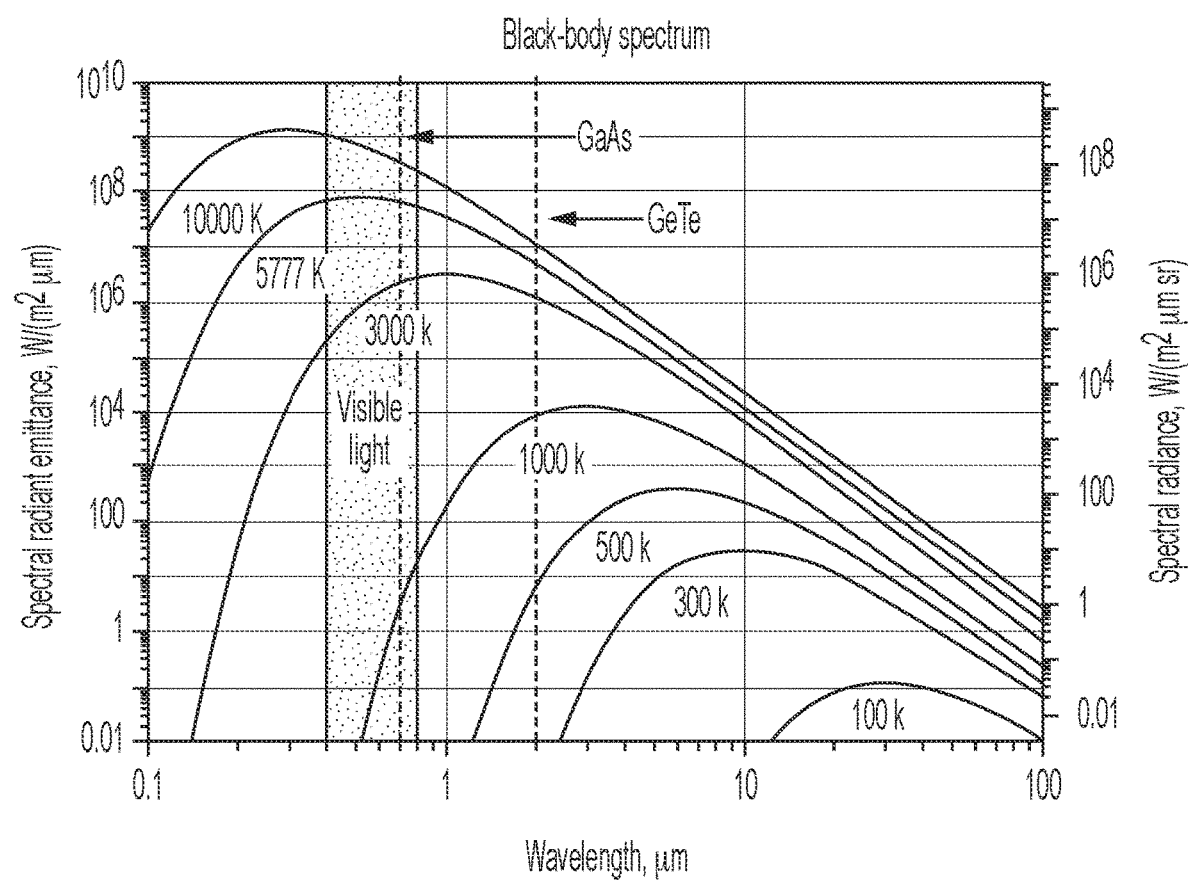
FIG. 6C shows the blackbody energy spectra with emphasis on the bandgap energies of GeTe and GaAs to illustrate the difference in absorbance as compared to the blackbody emission spectra for different heater temperatures.

While these examples focus on the growth of low bandgap germanium telluride (GeTe) (0.6 eV) on GaAs (1.43 eV), this method provides an efficient and cost effective way to provide temperature stability and uniformity in many MBE growth applications. FIG. 6C, for instance, shows the blackbody energy spectra with emphasis on the bandgap energies of GeTe and GaAs to illustrate the difference in absorbance as compared to the blackbody emission spectra for different heater temperatures. At growth temperatures close to 200° C., there is minimal blackbody energy radiated above the bandgap of GaAs, thus almost all absorption occurs undesirably within GeTe.

Figure 7:
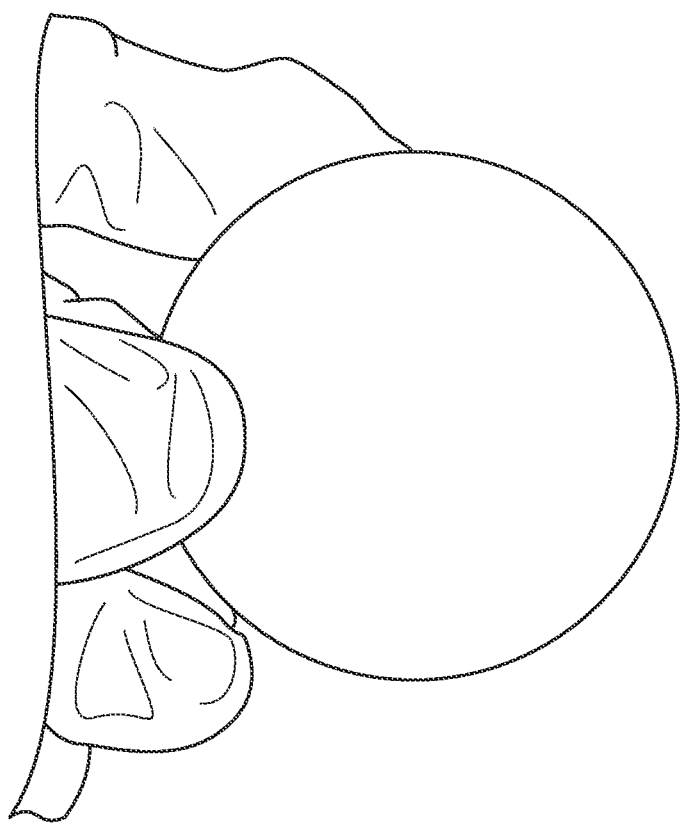
FIG. 7 shows a coated thermally conductive backing plate in accordance with certain embodiments.

In these example, the backing plates consist of a Mo metal base onto which a thin layer of $MoSi_2$ was plasma sprayed onto one side to create the bilayer. To prepare the $MoSi_2$ coated disks, a 0.76 mm thick 2 inch round piece of Mo was machined out of a flat plate of 99.9% pure Mo. One side was abraded and then subjected to 100 microns of $MoSi_2$ plasma spray coating to create a porous coating of $MoSi_2$ with high emissivity. A Mo backing plate on its own will not absorb enough heat radiatively from the heater to achieve the temperature (620° C.) required to desorb the oxide off the epi-ready GaAs surface, which is a key pre-growth step. $MoSi_2$ on the other hand has high emissivity over the wavelength ranges corresponding to the peak blackbody radiation from the heater. For example, Mo has an emissivity of approximately 0.04 whereas $MoSi_2$ has an emissivity of 0.65 at room temperature. At deposition temperatures (<250° C.), the $MoSi_2$ coating absorbs incoming radiation from the heater and thermal conduction from the Mo into the wafer dominates the heating resulting in a stable growth temperature window. FIG. 7 shows the image of the coated backing plate.

To demonstrate the advantages of this approach, GeTe was grown on semi-insulating (SI)-GaAs substrates both with and without the backing plate over a range of deposition times. Cell temperature was maintained constant throughout the growths at 1175° C. for the Ge cell and 360° C. for the Te cell. The beam equivalent pressure (i.e., Te/Ge flux ratio) as measured by the ion gauge was approximately 9. All substrates were heated to 620° C. under Te flux to remove the native oxide and then cooled to 200° C. The substrate temperature was allowed to stabilize at 200° C. before growth began. Note that all temperatures on the substrate refer to that measured by band edge spectroscopy (BES) just prior to the start of deposition, labeled as detector in FIG. 6A-6B. Once deposition began, the band edge temperature signal was lost due the opacity of the GeTe layer.

Figure 8:
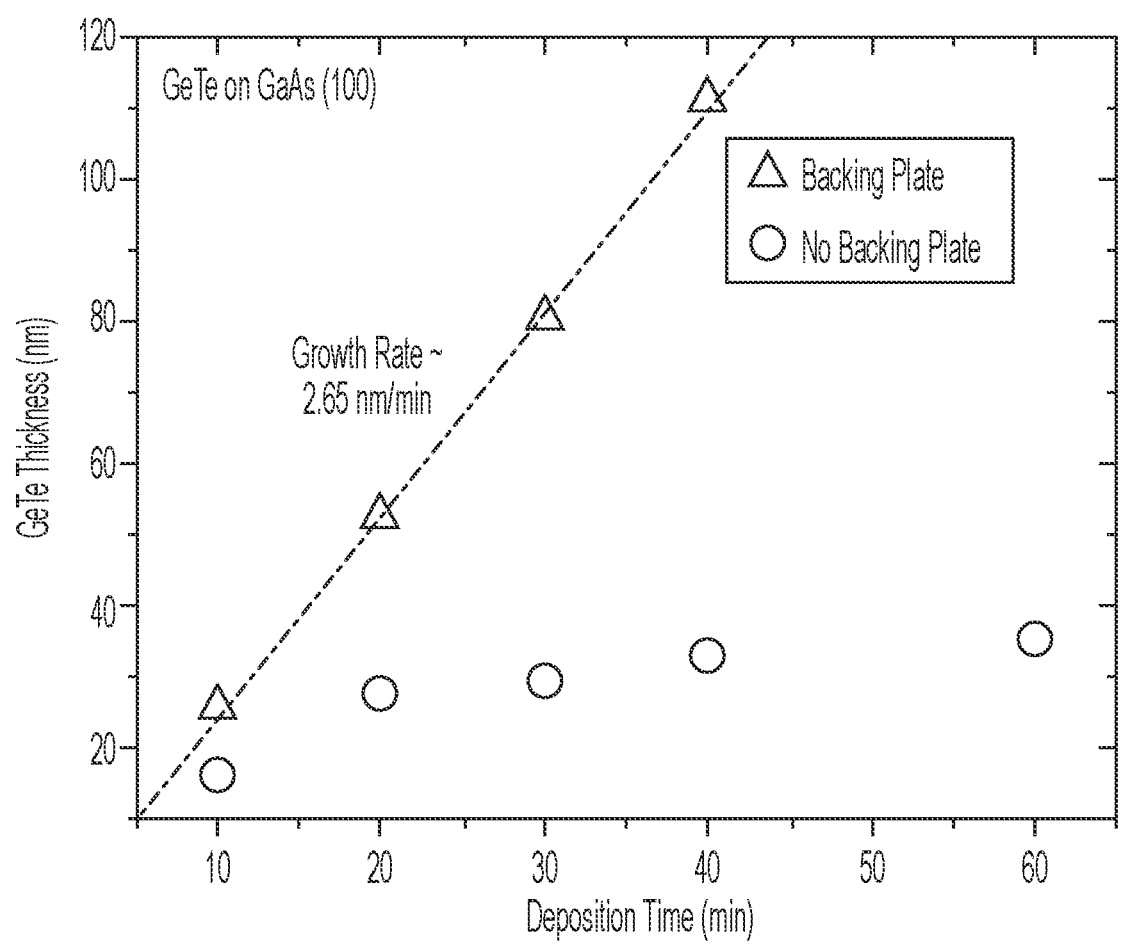
FIG. 8 is a plot of layer thickness versus deposition time.

The growth conditions were kept the same for all depositions except for the addition or removal of the backing plate. The layer thickness versus deposition time for the growths is shown in FIG. 8. As shown in FIG. 8, there is a clear distinction between the two sets of growths. For growths without a backing plate including the $MoSi_2$ coating, the thickness of the deposited film plateaus around 30-35 nm (as measured through x-ray reflectivity and ellipsometry), whereas the growth with the backing plate including the $MoSi_2$ coating remained at a constant growth rate of 2.65 nm/min over the entire deposition time. This indicates that, for samples utilizing the backing plate including the $MoSi_2$ coating, there is a constant growth temperature at which desorption and absorption rates remain constant throughout growth, resulting in continuous growth of material which is not possible without the backing plate including the $MoSi_2$ coating for temperature control. The thickness plateau in the non-backing plate samples is believed to be attributed to the increase in temperature of the substrate/film above the growth window as the film thickness increases, as will be discussed subsequently.

In previous work, a line of sight quadrupole mass spectrometer (QMS) was used to measure desorption of the surface as a function of deposition time and temperature for GeTe and the similar compound of $Ge_2Sb_2Te_5$ (GST). That work showed GeTe to have a narrow growth window where the normalized desorption is 0 (i.e., both Te and Ge readily deposit at approximately 190° C. substrate temperature and the normalized desorption is 1 at approximately 300° C.; Ge, Te and GeTe cannot absorb at the surface). It was observed that during deposition on a radiatively heated substrate, the species desorption increased and the heater output temperature needed to be compensated in order to maintain a constant temperature at the surface of the substrate and therefore a constant growth rate. Based on this prior work, the changing growth rate and thereby limited growth thickness of the non-backing plate samples shown in FIG. 8 can be attributed to the desorption of the GeTe as the film increased in temperature during deposition.

Figure 9A:
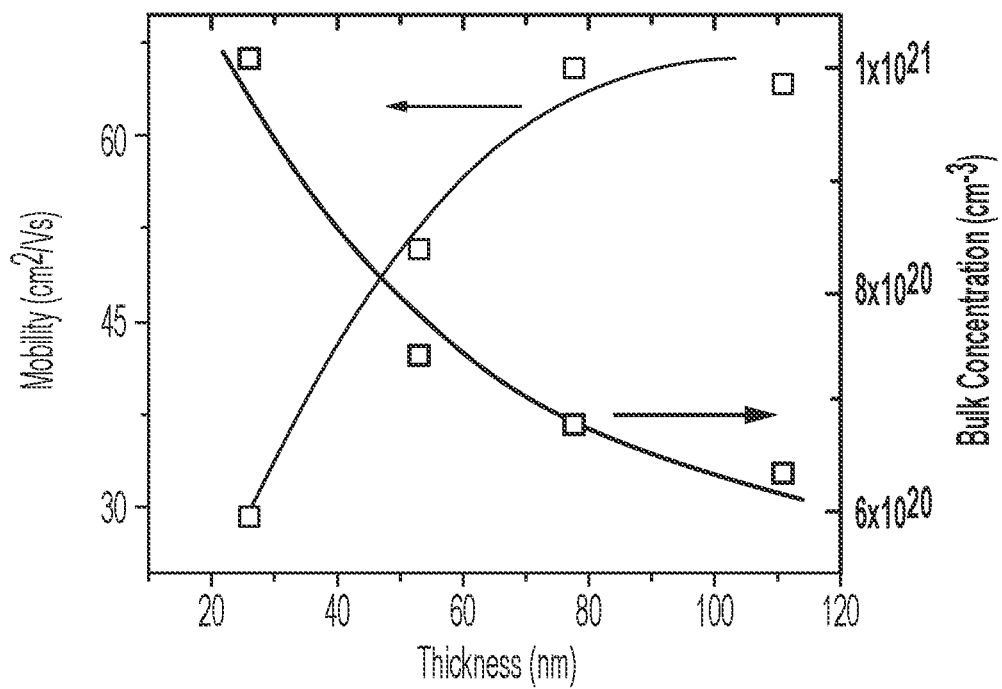
FIGS. 9A and 9B illustrate the electrical, transport, and structural properties of deposited GeTe films as a function of thickness.
Figure 9B:
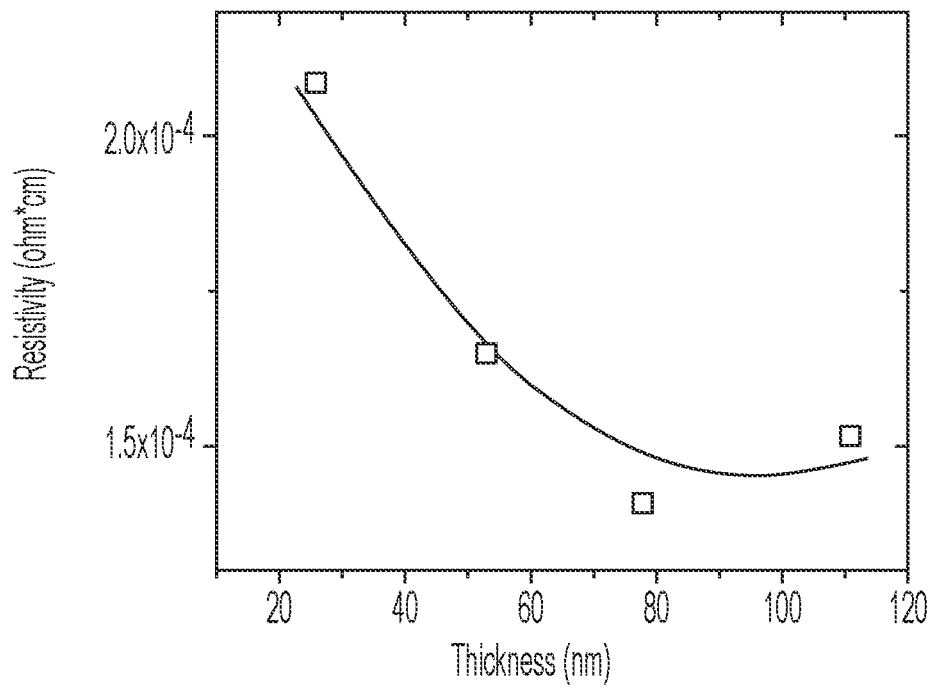
Figure 9C:
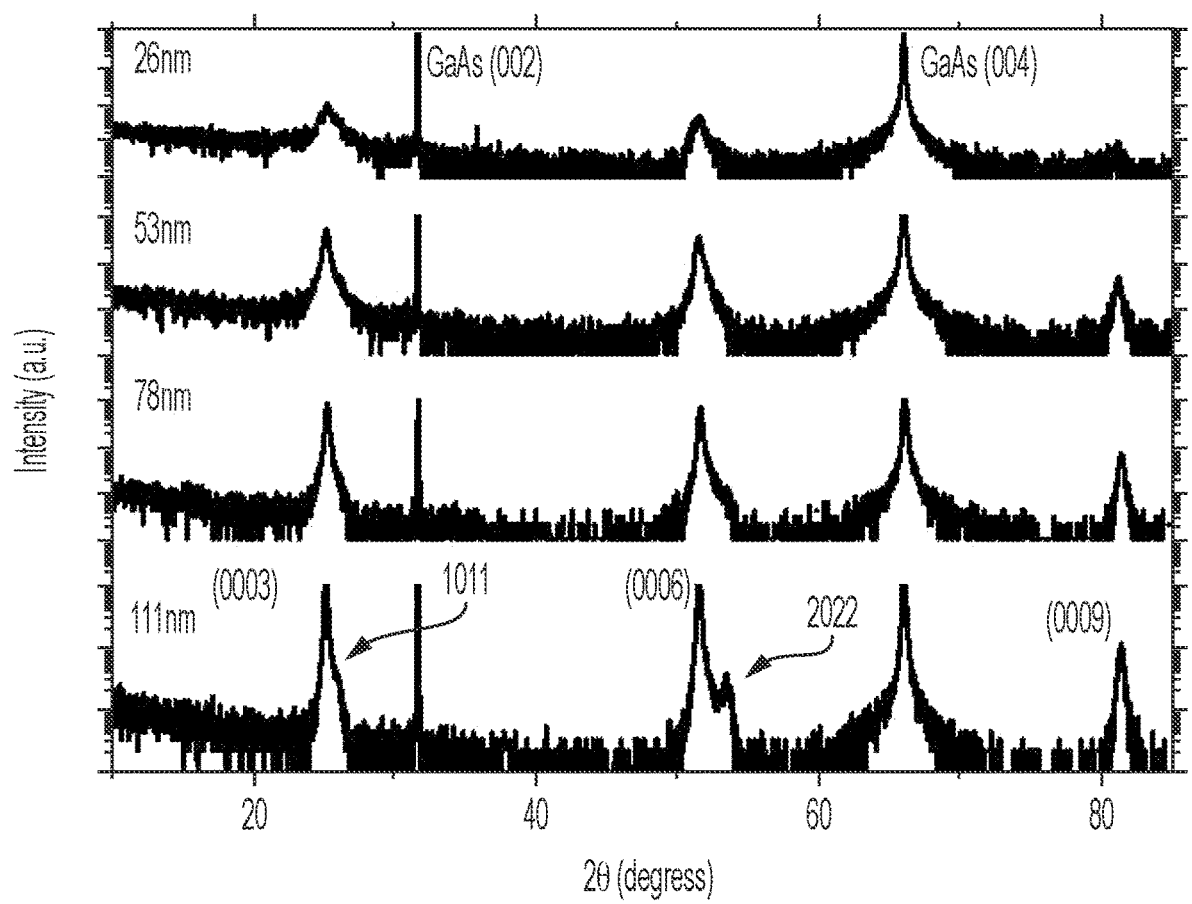
FIG. 9C shows the crystallographic data for samples using a thermally conductive backing plate including the $MoSi_2$ coating thereon.

The electrical, transport, and structural properties of the deposited GeTe films are shown in FIGS. 9A and 9B as a function of thickness. FIG. 9A shows the mobility and hole carrier concentration. As stable growth was not possible without the backing plate including the $MoSi_2$ coating, that data will not be discussed. Samples grown with a backing plate including the $MoSi_2$ coating behaved similar to other MBE grown GeTe and reached a mobility of 65 $cm^2$/Vs at approximately 100 nm. The carrier concentration was measured to be $6 \times 10^{20}$/$cm^3$. Resistivity in the material decreased as a function of temperature as shown in FIG. 9B. Crystallographic data for the samples using the backing plate including the $MoSi_2$ coating is given in FIG. 9C. As the sample becomes thicker, peak intensity increases. GeTe has a rhombohedral crystal structure and therefore hexagonal crystal notation is used rather than (hkl) miller indices. The $\{10\bar{1}1\}$ family of peaks arises from the underlying rock salt like structure and its relationship with the rhombohedral phase. It is also apparent that the distortion arises as a function of thickness and the {10$\bar{1}$1} family of peaks is not observed below approximately 50 nm of growth. X-ray data for the non-backing plate samples is not shown as there is no change in diffraction pattern or peak intensity once growth achieved approximately 35 nm.

The technique of using a $MoSi_2$-coated backing plate increases radiative absorption for the metal backing plate, decouples radiative transfer to the wafer from the heater, and ultimately, generates more efficient and uniform heating of the substrate via conductive transport. This method is not only used to grow single layer narrow bandgap chalcogenides such as GeTe and GST, but may also be applicable to the growth of any low bandgap material on higher bandgap substrates as well as superlattice structures. For example, in the field of topological insulator (TI) materials, considerable time has been spent developing epitaxial growth methods for materials such as $Sb_2Te_3$, $Bi_2Te_3$, $Sb_2Se_3$ which have bandgap energies on the order of 0.1-0.5 eV. For TI material, optically active and electrically conducting materials, the substrates of choice are oftentimes wide bandgap ionic solids such as $Al_2O_3$ or $BaF_2$, which would make this technique highly relevant in general for any architecture requiring a thicker MBE-deposited film.

These examples have demonstrated a novel method for stable temperature control to achieve MBE growth of GeTe on a higher bandgap substrate GaAs. This was achieved using a novel bilayer backing plate allowing for more efficient and uniform substrate temperature control. This method is not a solution solely for GeTe or chalcogenide growths, but rather for any narrow bandgap material grown on wider bandgap substrate. In order to achieve next generation devices for optical and electronic applications, it is vital to be able to precisely control material deposition as described herein.

These and other modifications and variations to additional example embodiments may be practiced by those of ordinary skill in the art without departing from the spirit and scope of the invention, which is more particularly set forth in the appended claims. In addition, it should be understood that aspects of the various embodiments may be interchanged in whole or in part. Furthermore, those of ordinary skill in the art will appreciate that the foregoing description is by way of example only, and it is not intended to limit the invention as further described in such appended claims. Therefore, the spirit and scope of the appended claims should not be limited to the exemplary description of the versions contained herein.

What is claimed is:

1. A molecular-beam epitaxy (MBE) system, comprising:
   (a) an ultra-high vacuum (UHV) chamber;
   (b) a heater consisting of infrared radiation (IR) emitting heater;
   (c) a thermally conductive backing plate including a first surface and a second surface;
   (d) an infrared-absorbing coating (IAC) deposited onto at least the first surface of the thermally conductive backing plate;
   (e) a substrate having a first bandgap positioned on the second surface of the thermally conductive backing plate;
   (f) at least one effusion cell directed towards the substrate; and
   (g) an MBE-film grown onto an outer surface of the substrate, the MBE-film having a second bandgap and comprises one or more chalcogenides;

wherein the IAC absorbs from 70 to 100% of radiant heat from the IR emitting heater and transfers the radiant heat to the substrate via thermal conduction,
   wherein the IR emitting heater is located (i) inside the UHV chamber and (ii) separately from the thermally conductive backing plate, and wherein the IR emitting heater is configured to emit IR directly onto the IAC, and
   wherein the first bandgap is larger than the second bandgap.

2. The MBE system of claim 1, wherein the IR emitting heater also emits radiation within wavelengths from 400 nanometers to 700 nanometers, and wherein the IAC absorbs from 88 to 100% of radiant heat from the IR emitting heater.

3. The MBE system of claim 1, wherein
   the IAC is located proximal to the heater, and
   the substrate is located distal to the heater, and
   wherein the a bandgap-ratio between the first bandgap and the second bandgap is from 2:1 to 70:1.

4. The MBE system of claim 1, wherein the system further comprises a vacuum source operatively connected to the UHV chamber, wherein the vacuum source forms a vacuum within the UHV chamber.

5. The MBE system of claim 1, wherein the thermally conductive backing plate comprises a material having a thermal conductivity of at least 20 W/m*K at 20° C.

6. The MBE system of claim 1, wherein
   the thermally conductive backing plate comprises a metal or a metal alloy, and
   the metal or the metal alloy comprises niobium or a niobium alloy, molybdenum or a molybdenum alloy, tantalum or a tantalum alloy, tungsten or a tungsten alloy, or rhenium or a rhenium alloy.

7. The MBE system of claim 1, wherein the thermally conductive backing plate is configured to rotate about a z-axis extending perpendicularly through the first surface and the second surface.

8. The MBE system of claim 1, wherein the IAC comprises a thermal plasma spray coating and has a thermal conductivity of at least 5 W/m*K at 20° C.

9. The MBE system of claim 1, wherein the substrate has a bandgap of at least 0.6 eV.

10. The MBE system of claim 1, wherein the IAC absorbs from all radiant heat from the IR emitting heater and transfers the radiant heat to the substrate via thermal conduction.

11. The MBE system of claim 1, wherein the IAC is molybdenum disilicide.

12. The MBE system of claim 1, wherein a bandgap-ratio between the first bandgap and the second bandgap is from 10:1 to 70:1.

13. The MBE system of claim 12, wherein the second bandgap of the MBE-film is from 0.1 to 0.5 eV.

14. The MBE system of claim 1, wherein the first bandgap of the substrate is from 4 to 10 eV.

15. The MBE system of claim 1, further comprising a conductivity enhancing material located between the thermally conductive backing plate and the IAC.

16. The MBE system of claim 15, wherein the conductivity enhancing material is in the form of a paste.

17. The MBE system of claim 15, wherein the conductivity enhancing material includes gallium or indium metals.

18. The MBE system of claim 15, wherein the conductivity enhancing material is in the form of a paste and includes silver or carbon flakes.

19. The MBE system of claim 1, wherein the IAC is plasma sprayed onto the first surface of the thermally conductive backing plate.

20. The MBE system of claim 1, wherein the IAC consists of molybdenum disilicide.

* * * * *